United States Patent
Ko et al.

(10) Patent No.: US 11,715,714 B2
(45) Date of Patent: *Aug. 1, 2023

(54) SEMICONDUCTOR DEVICES AND METHODS OF MANUFACTURING SEMICONDUCTOR DEVICES

(71) Applicant: Amkor Technology Singapore Holding Pte. Ltd., Valley Point (SG)

(72) Inventors: Yeong Beom Ko, Taichung (TW); Jo Hyun Bae, Incheon (KR); Sung Woo Lim, Seoul (KR); Yun Ah Kim, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 39 days.

This patent is subject to a terminal disclaimer.

(21) Appl. No.: 17/407,420

(22) Filed: Aug. 20, 2021

(65) Prior Publication Data

US 2021/0384151 A1    Dec. 9, 2021

Related U.S. Application Data

(63) Continuation of application No. 16/504,236, filed on Jul. 6, 2019, now Pat. No. 11,121,105.

(51) Int. Cl.
*H01L 23/00* (2006.01)
*H01L 21/56* (2006.01)
*H01L 23/528* (2006.01)
*H01L 23/31* (2006.01)

(52) U.S. Cl.
CPC .............. *H01L 24/09* (2013.01); *H01L 21/56* (2013.01); *H01L 23/3107* (2013.01); *H01L 23/5283* (2013.01); *H01L 2224/02371* (2013.01)

(58) Field of Classification Search
CPC ..... H01L 24/09; H01L 21/56; H01L 23/3107; H01L 23/5283; H01L 2224/02371
See application file for complete search history.

(56) References Cited

U.S. PATENT DOCUMENTS

| | | | |
|---|---|---|---|
| 6,940,154 B2 | 9/2005 | Pedon | |
| 11,121,105 B2* | 9/2021 | Ko | ............ H01L 24/02 |
| 2004/0178495 A1 | 9/2004 | Yean | |
| 2007/0181989 A1 | 8/2007 | Corisis et al. | |
| 2014/0054783 A1 | 2/2014 | Gong et al. | |
| 2015/0380386 A1 | 12/2015 | Vincent | |
| 2017/0084517 A1 | 3/2017 | Carney | |
| 2017/0162530 A1 | 6/2017 | Lin | |
| 2020/0411419 A1 | 12/2020 | Hatori | |

* cited by examiner

*Primary Examiner* — Fernando L Toledo
*Assistant Examiner* — Neil R Prasad
(74) *Attorney, Agent, or Firm* — Kevin B. Jackson

(57) ABSTRACT

In one example, a semiconductor device structure relates to an electronic device, which includes a device top surface, a device bottom surface opposite to the device top surface, device side surfaces extending between the device top surface and the device bottom surface, and pads disposed over the device top surface. Interconnects are connected to the pads, and the interconnects first regions that each extend from a respective pad in in an upward direction, and second regions each connected to a respective first region, wherein each second region extends from the respective first region in a lateral direction. The interconnects comprise a redistribution pattern on the pads. Other examples and related methods are also disclosed herein.

20 Claims, 7 Drawing Sheets

SEMICONDUCTOR DEVICES AND METHODS OF MANUFACTURING SEMICONDUCTOR DEVICES

CROSS-REFERENCE TO RELATED APPLICATIONS

This application is a continuation application of co-pending U.S. patent application Ser. No. 16/504,236 filed on Jul. 6, 2019 and issued as U.S. Pat. No. 11,121,105 on Sep. 14, 2021, which is expressly incorporated by reference herein, and priority thereto is hereby claimed.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
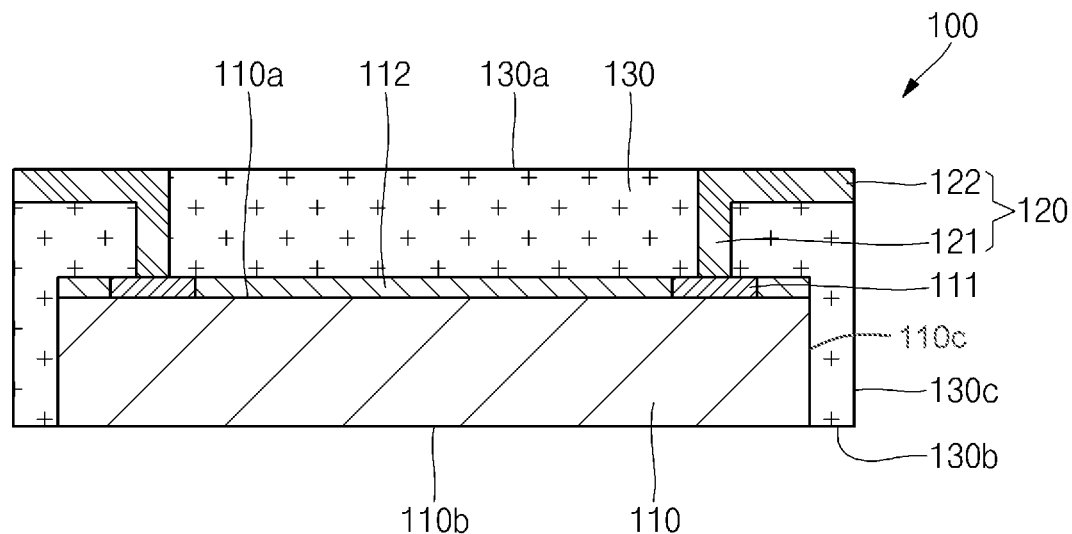
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," "including" are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements. It is further understood that the examples illustrated and described hereinafter suitably may have examples and/or may be practiced in the absence of any element that is not specifically disclosed herein.

DETAILED DESCRIPTION OF THE DRAWINGS

The present description includes, among other features, a packaged electronic device structure and associated methods that comprise interconnects attached to an electronic device. The interconnects include a first region extending in an upward direction from the electronic device, and a second region connected to the first region. The second region extends from the first region in a lateral direction. In some examples, the electronic device and portions of the interconnects are covered with an encapsulant. In some examples other portions of the interconnects are exposed from the encapsulant. Among other things, the structure and method provide a more cost-effective redistribution pattern for the electronic device, which uses a simplified process flow, provides a better form factor redistribution, and provides a faster electrical path.

More particularly, in one example, a packaged electronic device structure includes an electronic device having a device top surface, a device bottom surface opposite to the device top surface, and a device side surface extending between the device top surface and the device bottom surface. An interconnect is connected to the device top surface and includes a first region that extends from the device top surface in an upward direction, and a second region connected to the first region, wherein the second region extends from the first region in a lateral direction. An encapsulant covers the device top surface, the device side surface, and a periphery of the first region, wherein, a first portion of the second region is exposed from a first surface of the encapsulant, a second portion of the second region is exposed from a second surface of the encapsulant, and the encapsulant covers a third portion of the second region. In some examples, the electronic device comprises an active or passive device. In other examples, the electronic device comprises a semiconductor device. In some examples, the first region and the second region are an integral structure provided as part of a subsequently singulated leadframe structure. In some examples, the second region lateral extends beyond a perimeter of the electronic device.

In another example, a semiconductor device structure includes an electronic device having a device top surface, a device bottom surface opposite to the device top surface, device side surfaces extending between the device top surface and the device bottom surface, and pads disposed over the device top surface. Interconnects are connected to the pads, and the interconnects include first regions that each extend from a respective pad in in an upward direction, and second regions each connected to a respective first region, wherein each second region extends from the respective first region in a lateral direction. The interconnects comprise a redistribution pattern on the pads.

In a further example, a method for making a semiconductor device includes providing a substrate comprising a plurality of electronic devices formed as part of the substrate. The method includes attaching interconnects to pads on the electronic devices, wherein each interconnect spans between neighboring electronic devices, wherein each interconnect has first regions coupled to respective pads of the respective neighboring electronic devices and extending in an upward direction, and a second region structure connecting the first regions to each other in a lateral direction. The method includes singulating the substrate and the plurality of interconnects to separate each second region structure into second regions and the substrate into individual electronic devices.

Other examples are included in the present disclosure. Such examples may be found in the figures, in the claims, and/or in the description of the present disclosure.

Figure 2:
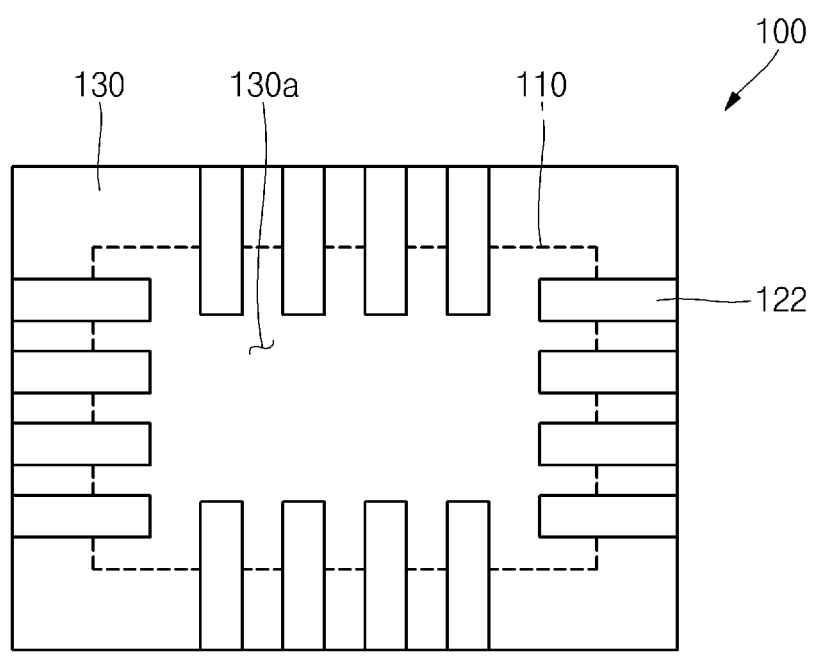
FIG. 2 shows a plan view of an example semiconductor device.
Figure 3:
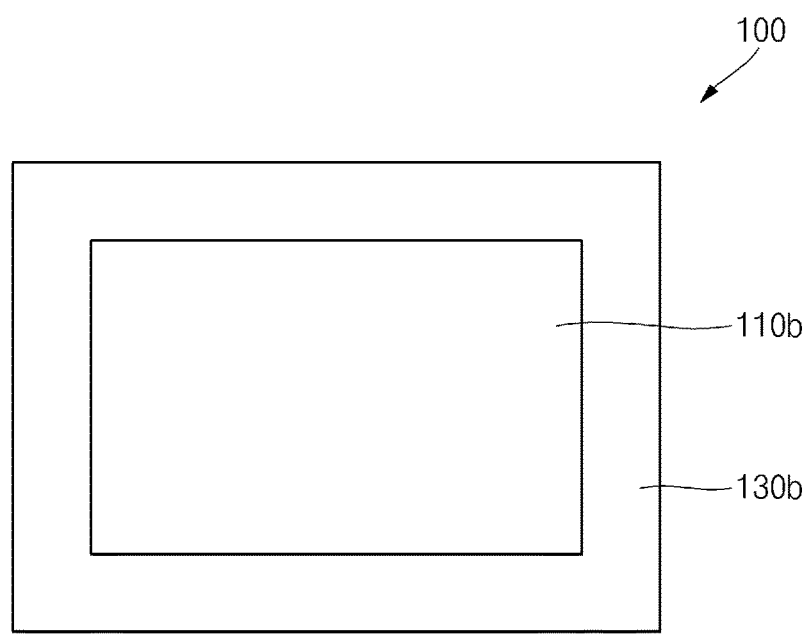
FIG. 3 shows a bottom view of an example semiconductor device.

FIG. 1 shows a cross-sectional view of an example semiconductor device, FIG. 2 shows a plan view of an example semiconductor device, and FIG. 3 shows a bottom view of an example semiconductor device.

Referring to FIGS. 1 to 3, example semiconductor device 100 can comprise electronic device 110, interconnects 120 and an encapsulant 130.

Electronic device 110 can be a semiconductor die, a semiconductor component, an optical device, a sensor device, or other active or passive devices as known to one of ordinary skill in the art. Electronic device 110, can comprise a device top surface 110a or first surface 110a that is substantially planar, a device bottom surface 110b or second surface 110b that is opposite to first surface 110a and is substantially planar, and a device side surface 110c or third surface 110c that extends between first surface 110a and second surface 110b. A pad 111 through which an electrical signal is input/output to/from electronic device 110, and a dielectric 112 which covers the periphery of pad 111, can be provided on first surface 110a of electronic device 110.

Pad 111 can include a plurality of pads on first surface 110a of electronic device 110 and spaced apart from each other. Pad 111 is exposed from first surface 110a of electronic device 110, and an external electrical signal can be input/output to/from electronic device 110 through pad 111. Pad 111 can be referred to as a bond pad or a die pad, and can include any of copper, gold, silver and aluminum.

Dielectric 112 can be provided to cover the periphery of pad 111 on first surface 110a of electronic device 110 and can electrically insulate first surface 110a of electronic device 110, except for any portion corresponding to pad 111. Dielectric 112 can be referred to as a non-conductive material or a passivation layer. Dielectric 112 can be provided to have the same height with or a slightly greater height than pad 111. In some examples, dielectric 112 can extend to cover a periphery of a top pad surface of pad 111, without covering a contact portion of the top pad surface.

Electronic device 110 can be electrically connected external to semiconductor device 100 through various interconnects 120 coupled to pad 111. Interconnects 120 can comprise or be referred to as leads or as a redistribution structure or pattern. In some examples, interconnects 120 can be part of a leadframe. Interconnects 120 can comprise, for example, copper, gold, silver, or aluminum. Each of interconnects 120 can comprise a first region 121 connected to pad 111 and a second region 122 extending from first region 121. First region 121 can be electrically coupled to pad 111 and can protrude from pad 111 in a first direction, such as vertically or upward. In addition, in an example implementation of the present disclosure, first region 121 can extend in the first direction substantially perpendicular to pad 111. Second region 122 can extend from first region 121 in a second direction, such as horizontally or laterally. The second direction can be different from the first direction in which first region 121 extends. In one example, second region 122 can extend in a direction substantially perpendicular to first region 121. Interconnects 120 can be configured to further extend past a footprint or area of electronic device 110 by an extending length of second region 122. Accordingly, interconnects 120 can function to perform redistribution on pad 111 of electronic device 110.

Interconnects 120 can be directly connected to pad 111 of electronic device 110, shortening electrical paths. Through interconnects 120, an electrical pattern can be formed at or to any location without being limited to the location of pad 111 of electronic device 110.

Encapsulant 130 can be provided to fill gaps between electronic device 110 and interconnects 120. Encapsulant 130 made of a non-conductive material can maintain interconnects 120 insulated from one another. In addition, encapsulant 130 can encapsulate side surfaces 110c of electronic device 110 and to encapsulate some regions of pad 111 of electronic device 110 and dielectric 112. Encapsulant 130, encapsulating the periphery of first region 121 of each of interconnects 120 connected to pad 111, can maintain a structural integrity of the connection between pad 111 and interconnects 120. Encapsulant 130 can comprise or be referred to as a mold compound or a resin, but this is not a limitation of the present disclosure.

First surface 130a of encapsulant 130 can be substantially coplanar with a top surface of second region 122 of each interconnect 120, exposing second region 122. Third surface 130c of encapsulant 130 can be substantially coplanar with an end portion of second region 122 extended in the second direction to expose the end portion of second region 122. Accordingly, second region 122 of interconnect 120 can be exposed from encapsulant 130 and can be subsequently connected to a circuit or device external to semiconductor device 100. Second surface 130b of encapsulant 130 can be parallel with second surface 110b of electronic device 110, and can expose second surface 110b of electronic device 110 in some examples. The exposed second surface 110b can improve heat radiation from electronic device 110. In some examples, first surface 130a, second surface 130b and third surface 130c of encapsulant 130 can be referred to as a top surface, a bottom surface, and a side surface of encapsulant 130, respectively.

FIGS. 4A to 4G show cross-sectional views of an example method for manufacturing an example semiconductor device.

Figure 4A:
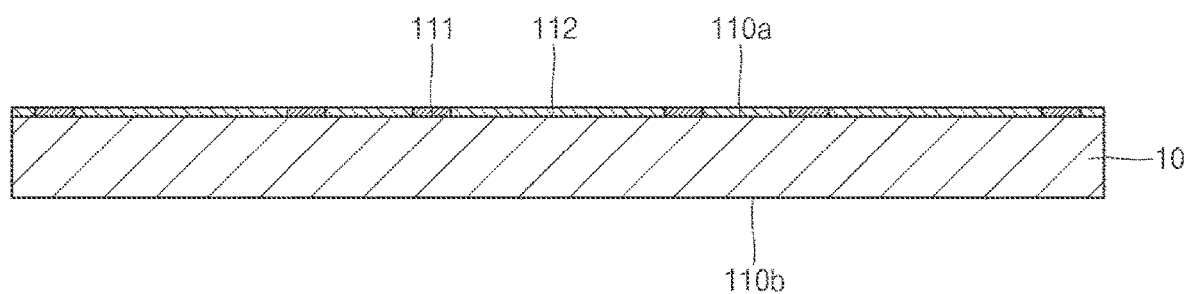
FIGS. 4A, 4B, 4C, 4D, 4E, 4F, and 4G show cross-sectional views of an example method for manufacturing an example semiconductor device.

Referring to FIG. 4A, the example method for manufacturing semiconductor device 100 according to the present disclosure can comprise providing substrate 10. Substrate 10 can be configured such that a plurality of electronic devices are consecutively arranged. Substrate 10 can also be referred to as a wafer, a strip or a plane. Pad 111 and dielectric 112 can be provided on first surface 110a of substrate 10 so as to correspond to regions of each electronic device. First surface 110a of substrate 10 can constitute a first surface of an electronic device. In addition, dielectric 112 can be provided across first surface 110a of substrate 10 while filling a gap between pad 111 and a neighboring pad 111.

Figure 4B:
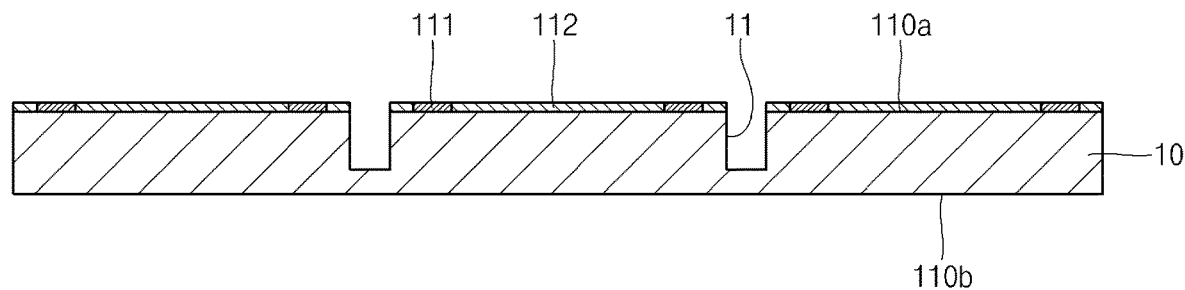

Referring to FIG. 4B, grooves 11 can be formed inwardly from first surface 110a of substrate 10 in a later stage. Grooves 11 can be formed by partially sawing or etching from first surface 110a of substrate 10. First surface 110a of substrate 10 can be divided into regions corresponding to the respective electronic devices along regions of grooves 11. In addition, grooves 11 can perform functions of scribing lines for singulation in a later stage.

Figure 4C:
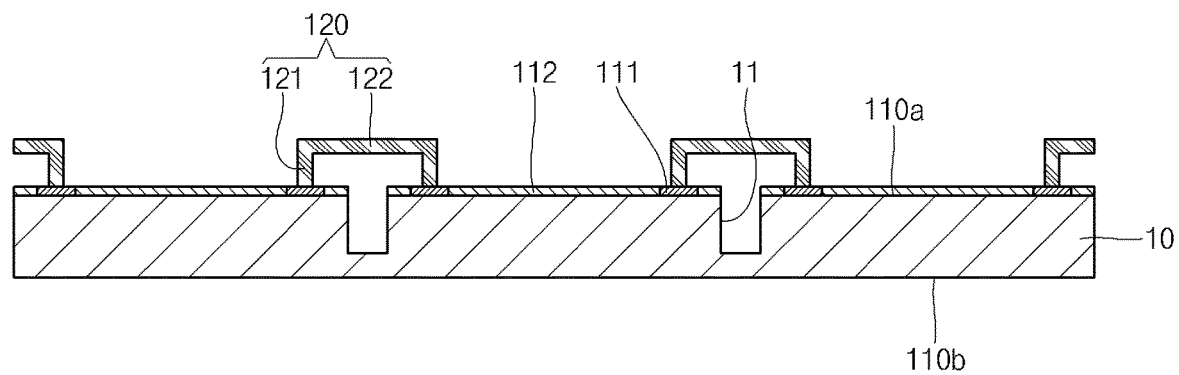

Referring to FIG. 4C, interconnects 120 can be provided around grooves 11. Interconnects 120 can connect pads 111 to each other between neighboring electronic devices. In detail, interconnects 120 can comprise a plurality of first regions 121 coupled to the respective pads 111 in a first direction and second regions 122 connecting first regions 121 to each other in a second direction. First regions 121 and second regions 122 of interconnects 120 can be integrally formed. For example, first regions 121 and second regions 122 can be formed from the same work piece or material and bent to provide the desired shape as part of lead frame. In addition, interconnects 120 can be prefabricated structures to be coupled to pads 111. In some examples, interconnects 120 can be formed as or from a leadframe. Interconnects 120 can be made of copper, gold, silver or aluminum.

Figure 4D:
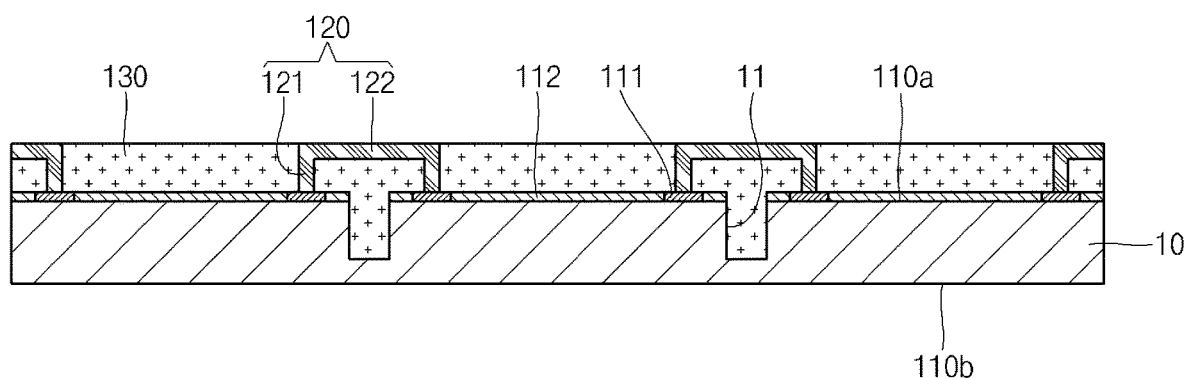

Referring to FIG. 4D, encapsulant 130 can be provided on first surface 110a of substrate 10. Encapsulant 130 can fill grooves 11 on first surface 110a of substrate 10. In addition, encapsulant 130 can fill portions between each of interconnects 120 and portions between each of interconnects 120 and first surface 110a of substrate 10. Encapsulant 130 can have the same height with interconnects 120 to expose interconnects 120. In some examples, an initial encapsulant height of encapsulant 130 can be taller than the height of interconnects 120, completely encapsulating interconnect 120, and then the initial encapsulant height can be reduced, such as by grinding, to reveal the top of interconnects 120.

Figure 4E:
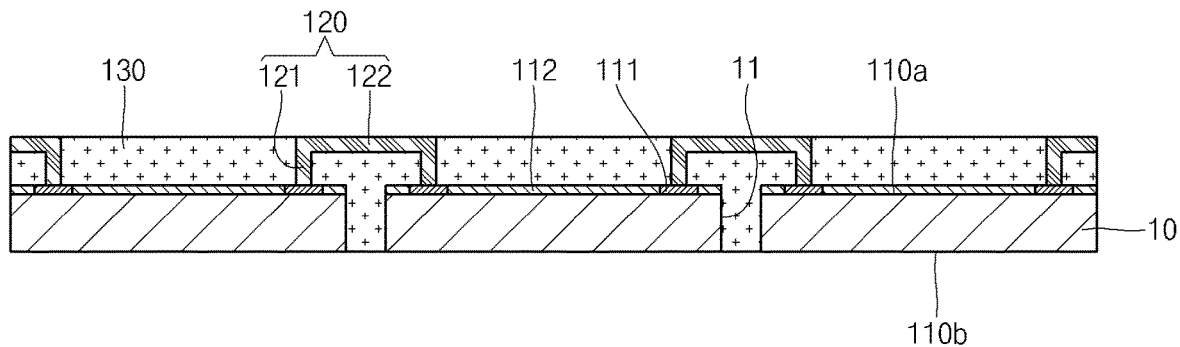

Referring to FIG. 4E, substrate 10 can be removed from second surface 110b opposite to first surface 110a of substrate 10 by a predetermined thickness. Second surface 110b of substrate 10 can be removed by grinding or polishing. In some cases, second surface 110b of substrate 10 can also be removed by etching. Second surface 110b of substrate 10 can be a bottom surface of substrate 10. In addition, removing of some regions of second surface 110b can comprise removing second surface 110b to a predetermined thickness to exposed grooves 11. Therefore, substrate 10 can be divided into regions of the respective electronic devices. In addition, second surface 110b of substrate 10 can constitute second surfaces of the respective electronic devices.

Figure 4F:
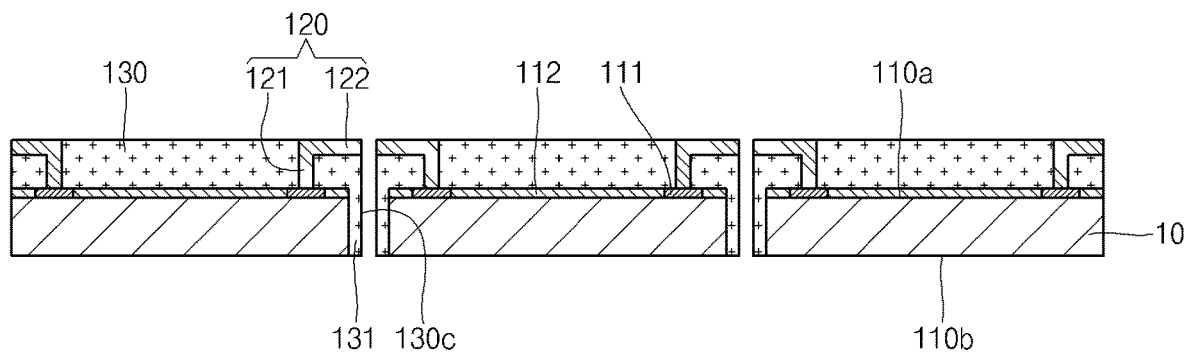
Figure 4G:
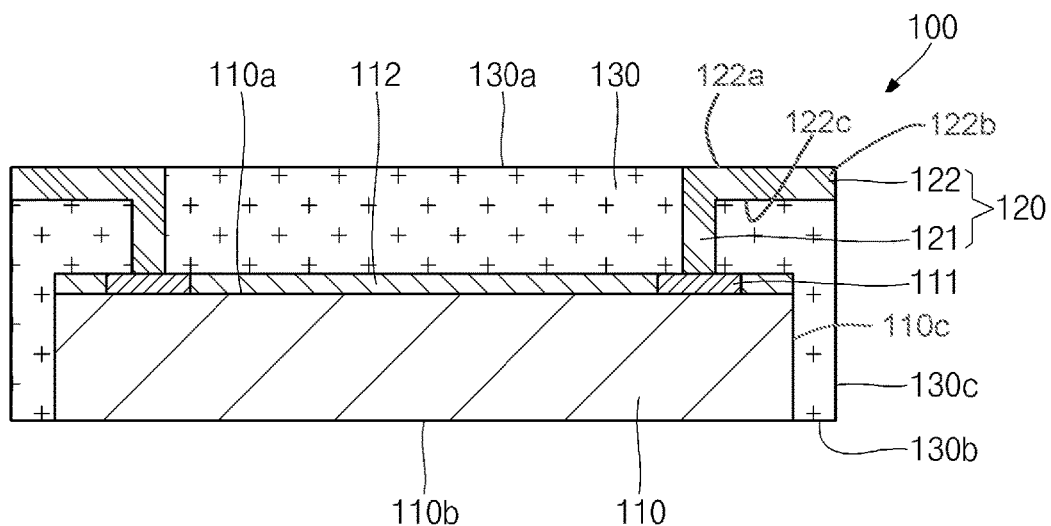

Referring to FIG. 4F, singulation or a singulating process can be performed on substrate 10. Singulation can be performed using sawing. As a result of singulation, individual electronic devices 110 can be separated from substrate 10. In addition, singulation can be performed along grooves 11 of substrate 10. A singulation width can be smaller than widths of grooves 11. Therefore, like in configuration of semiconductor device 100 shown in FIG. 4G, encapsulant 130 previously positioned in existing grooves 11 can be located on a side surface 110c of electronic device 110 having undergone singulation. In addition, since side surface 110c of electronic device 110 is not exposed to the outside, encapsulant 130 can protect electronic device 110 from external factors. As illustrated in FIG. 4G, second region 122 overlaps side surface 110c of electronic device 110 so as to extend outside a perimeter of electronic device 110. As further illustrated in FIG. 4G, a first portion 122a of second region 122 is exposed from first surface 130a of encapsulant 130 and can be substantially coplanar with first surface 130a. A second portion 122b of second region 122, such as an end portion, is exposed in another surface 130c of encapsulant 130 and can be substantially coplanar with the surface 130c. A third portion 122c of second region 122 can be covered by encapsulant 130.

According to the present manufacturing method, electrical connections of electronic devices 110 can be performed through interconnects 120, thereby rapidly establishing electrical paths and simplifying the overall process for manufacturing semiconductor device 100.

Figure 5:
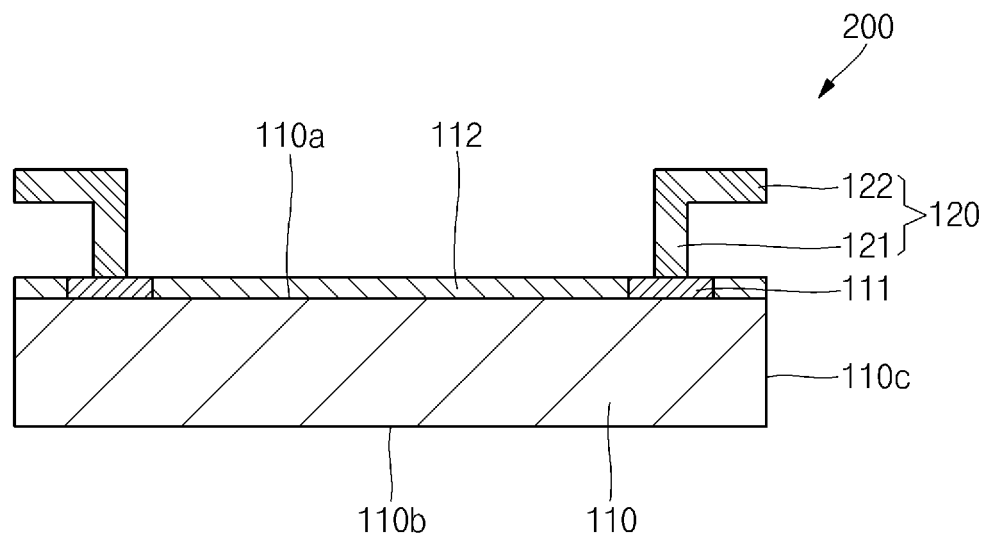
FIG. 5 shows a cross-sectional view of an example semiconductor device.
Figure 6:
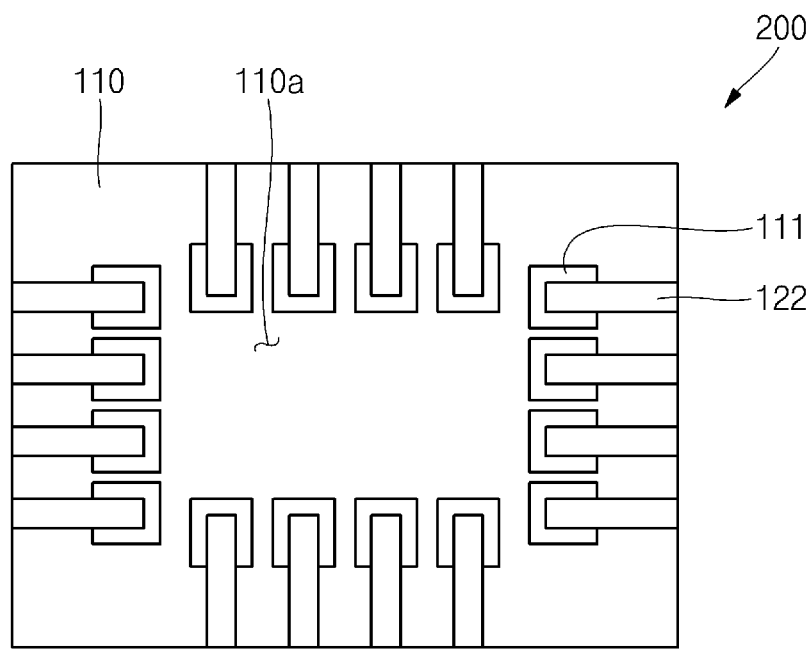
FIG. 6 shows a plan view of an example semiconductor device.

FIG. 5 shows a cross-sectional view of an example semiconductor device. FIG. 6 shows a plan view of an example semiconductor device.

Referring to FIGS. 5 and 6, example semiconductor device 200 can comprise an electronic device 110 and interconnects 120.

Electronic device 110 can comprise a first surface 110a that is substantially planar, a second surface 110b that is opposite to first surface 110a and is substantially planar. A pad 111 through which an electrical signal is input/output to/from electronic device 110, and a dielectric 112 which covers the periphery of pad 111, can be provided on first surface 110a of electronic device 110.

Pad 111 can include a plurality of pads on first surface 110a of electronic device 110 and spaced apart from each other. Pad 111 is exposed from first surface 110a of electronic device 110, and an external electrical signal can be input/output to/from electronic device 110 through pad 111. Pad 111 can be referred to as a bond pad or a die pad, and can include any of copper, gold, silver and aluminum.

Pad 111 can be exposed, as shown in the drawings. When pad 111 is made of materials such as copper or silver, a plating for preventing oxidation can be further provided on portions of pad 111 intended to be electrically connected to interconnects 120. Plating can be provided using, for example, nickel, zinc or tin. If pad 111 is instead made of material such as aluminum, an oxide film is naturally formed by anodizing remaining portions of pad 111, other than portions electrically connected to interconnects 120, thereby performing an insulating function.

Dielectric 112 can be provided to cover the periphery of pad 111 on first surface 110a of electronic device 110 and can electrically insulate first surface 110a of electronic device 110, except for any portion corresponding to pad 111. Dielectric 112 can be referred to as a non-conductive material or a passivation layer. Dielectric 112 can have the same height with or a slightly greater height than pad 111. In some examples, dielectric 112 can extend to cover a periphery of a top pad surface of pad 111, without covering a contact portion of the top pad surface.

Interconnects 120 can be coupled to pad 111 of electronic device 110. Interconnects 120 can comprise or be referred to as leads or as a redistribution structure or pattern. In some examples, interconnects 120 can be part of a leadframe. Interconnects 120 can comprise, for example, copper, gold, silver, or aluminum. Each of interconnects 120 can comprise a first region 121 connected to pad 111 and a second region 122 extending from first region 121. First region 121 can be electrically coupled to pad 111 and can protrude from pad 111 in a first direction. In addition, in an example implementation of the present disclosure, first region 121 can extend in the first direction substantially perpendicular to pad 111. Second region 122 can extend from first region 121 in a second direction. The second direction can be different from the first direction in which first region 121 extends. In one example, second region 122 can extend in a direction substantially perpendicular to first region 121. Interconnects 120 can be configured to further extend past a footprint or area of electronic device 110 by an extending length of second region 122. Accordingly, interconnects 120 can function to perform redistribution on pad 111 of electronic device 110.

FIGS. 7A to 7D show cross-sectional views of an example method for manufacturing an example semiconductor device.

Figure 7A:
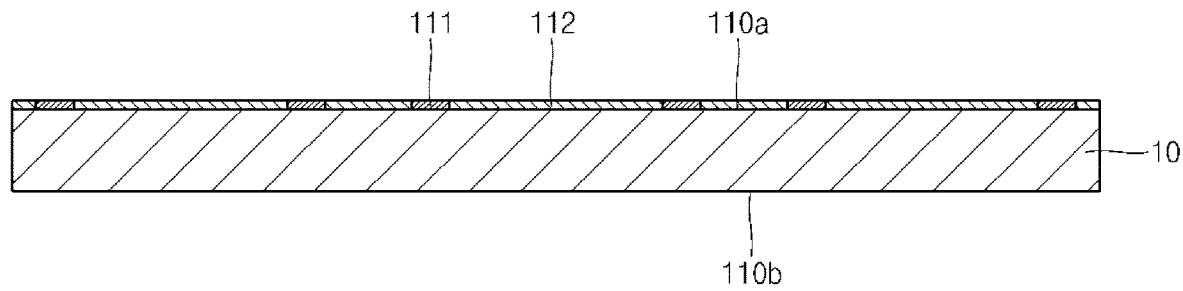
FIGS. 7A, 7B, 7C, and 7D show cross-sectional views of an example method for manufacturing an example semiconductor device.

Referring to FIG. 7A, the example method for manufacturing semiconductor device 200 according to the present disclosure can comprise providing substrate 10. Substrate 10 can be configured such that a plurality of electronic devices are consecutively arranged. Substrate 10 can also be referred to as a wafer, a strip or a plane. Pad 111 and dielectric 112 can be provided on first surface 110a of substrate 10 so as to correspond to regions of each electronic device. First surface 110a of substrate 10 can constitute a first surface of an electronic device. In addition, dielectric 112 can be provided on the entire first surface 110a of substrate 10 while filling a gap between pad 111 and a neighboring pad 111.

Figure 7B:
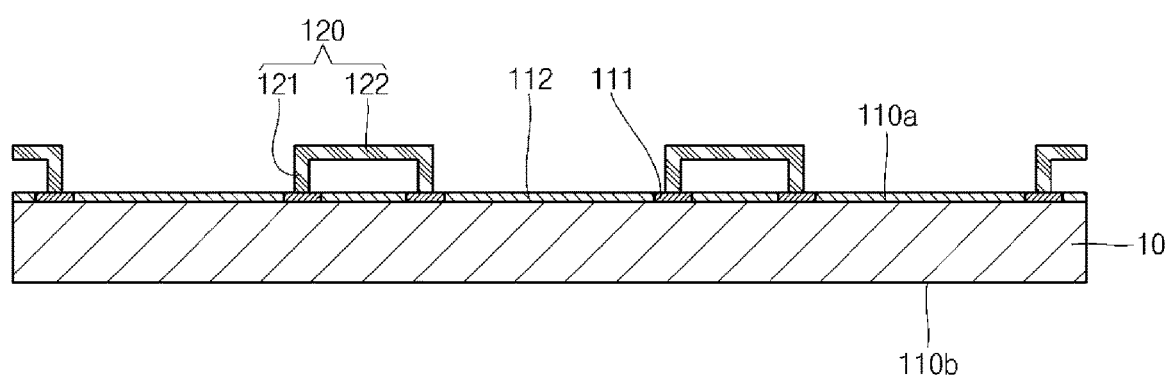

Referring to FIG. 7B, interconnects 120 can be provided on connect pads 111 of neighboring electronic devices on first surface 110a of substrate 10. Interconnects 120 can connect pads 111 of neighboring electronic devices.

Interconnects 120 can comprise a plurality of first regions 121 coupled to the respective pads 111 in a first direction and second regions 122 connecting first regions 121 to each other in a second direction. First regions 121 and second regions 122 of interconnects 120 can be integrally formed. In addition, interconnects 120 can be prefabricated structures to be coupled to pads 111. In some examples, interconnects 120 can be formed as or from a leadframe. Interconnects 120 can be made of copper, gold, silver or aluminum.

Figure 7C:
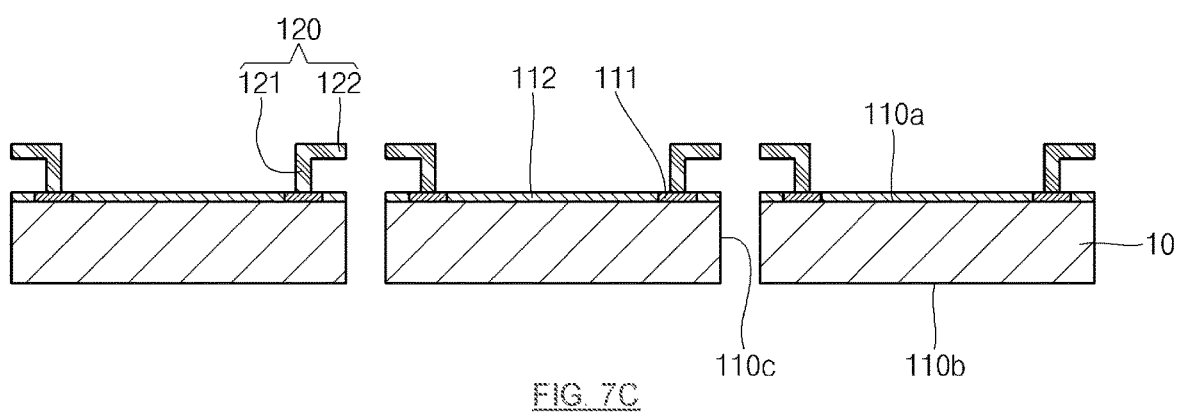

Referring to FIG. 7C, singulation or a singulating process can be performed on substrate 10. Singulation can be performed using sawing or cutting. As a result of singulation, individual electronic devices 110 can be separated from substrate 10. In addition, singulation can be performed to separate second regions 122 of interconnects 120 together with substrate 10. Therefore, pads 111 of neighboring electronic devices 110 connected to each other by interconnects 120 can be separated from one another.

Figure 7D:
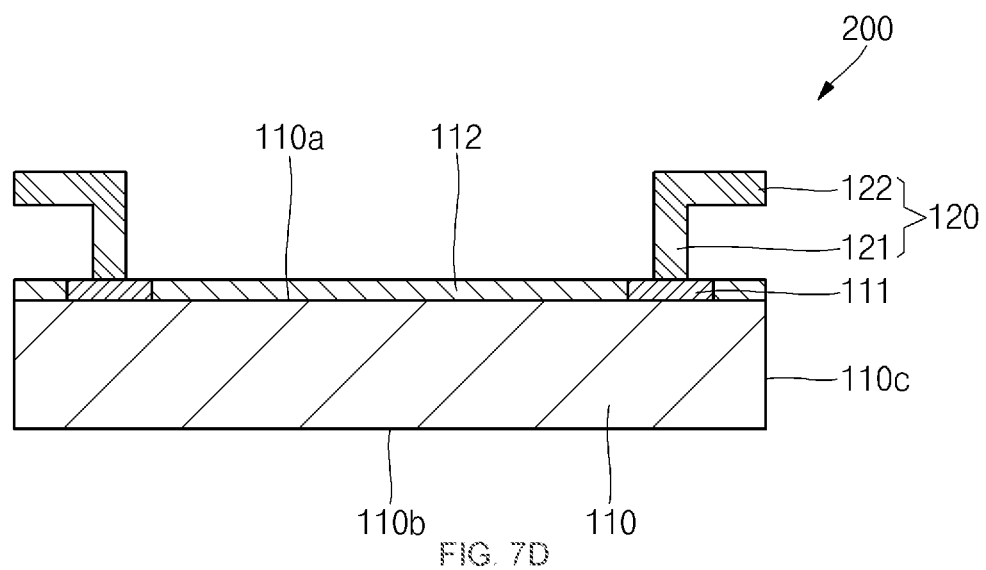

As shown in FIG. 7D, electronic device 110 having undergone singulation can be configured to include interconnects 120 individually connected to respective pads 111. In addition, since semiconductor device 200 is configured such that interconnects 120 are formed on electronic device 110, the manufacturing process can be simplified and electrical paths can be rapidly established through interconnects 120. In addition, redistribution can be performed on pad 111 of electronic device 110 by a configuration in which first regions 121 and second regions 122 of interconnects 120 are extended.

From all of the foregoing, one skilled in the art can determine that according to another example, a method for making a semiconductor device comprises providing a substrate comprising a plurality of electronic devices formed as part of the substrate. The method includes forming grooves extending partially inward from a first surface of the substrate between the plurality of electronic devices. The method includes coupling interconnects to pads on the electronic devices, wherein each interconnect spans across one of the grooves between neighboring electronic devices, wherein each interconnect comprises first regions coupled to respective pads of the respective neighboring electronic devices in an upward direction, and a second region structure connecting the first regions to each other in a lateral direction. The method includes providing an encapsulant on the first surface of the substrate and within the grooves so that the encapsulant fills portions between each of the interconnects and fills portions between each of the interconnects and the first surface of the substrate. The method includes removing a portion of the substrate from a second surface of the substrate opposite to the first surface to expose the encapsulant from the second surface. The method includes singulating the substrate and the interconnects through portions of the grooves to separate the interconnects and the substrate into individual electronic devices.

In a further example, portions of the encapsulant remain on side surfaces of the electronic devices after the step of singulating. In a still further example, coupling interconnects comprises coupling the interconnects provided as a lead frame. In another example, providing the encapsulant comprises covering first sides of the second regions with the encapsulant while leaving second sides of the second regions exposed from the encapsulant.

In summary, structures and methods have been described that relate to an electronic device having an interconnect structure. In some examples, the interconnect structure includes a plurality of interconnects each having a first region that extends in aft a first or upward direction from a surface of the electronic device, and a second region connected to the first region that extends in a second or lateral direction from the first region. In some examples, the interconnects are provided as part of a lead frame that can be attached to a substrate containing a plurality of electronic devices as part of a method of manufacture. In some examples, singulation can be used to separate the interconnects and the substrate at the same time to provide the electronic devices. The interconnects can be part of a redistribution pattern or structure for the electronic device that provides a better form factor. Among other things, the structure and method provide a more cost-effective redistribution pattern for the electronic device, which uses a simplified process flow and provides an efficient electrical path.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A method for making a semiconductor device, comprising:
   providing a substrate comprising:
      a substrate first surface;
      a substrate second surface opposite to the substrate first surface; and electronic devices formed as part of the substrate and separated by spaces, wherein each electronic device has pads formed over the substrate first surface;

attaching leadframe interconnects to the pads, wherein each leadframe interconnect spans the spaces between neighboring electronic devices, and wherein each leadframe interconnect comprises:
first regions coupled to respective pads of respective neighboring electronic devices and extending in a first direction, and
a second region structure coupling the first regions to each other in a second direction that is different than the first direction;

providing an encapsulant on the substrate first surface so that the encapsulant is between each of the leadframe interconnects and is between each of the leadframe interconnects and the substrate first surface; and singulating the substrate and the leadframe interconnects to separate each second region structure into second regions and the substrate into individual electronic devices.

2. The method of claim 1, further comprising:
forming grooves extending partially inward from the substrate first surface and within the spaces, wherein:
providing the encapsulant comprises providing the encapsulant within the grooves.

3. The method of claim 2, wherein:
forming the grooves occurs before attaching the leadframe interconnects.

4. The method of claim 1, wherein:
the first direction is substantially perpendicular to the second direction.

5. The method of claim 1, wherein:
the second direction is substantially parallel to the substrate first surface.

6. The method of claim 1, further comprising:
removing a portion of the substrate second surface before singulating the substrate.

7. The method of claim 1, wherein:
portions of the encapsulant remain on side surfaces of the electronic devices after the singulating.

8. The method of claim 1, wherein:
one of the electronic devices has a side surface devoid of the encapsulant.

9. The method of claim 1, wherein:
providing the encapsulant comprises covering first sides of each second region structure with the encapsulant, and leaving second sides of each second region structure exposed from the encapsulant.

10. The method of claim 1, wherein:
singulating comprises singulating the leadframe interconnects so that the second regions extend to laterally overlap side surfaces of the electronic devices.

11. A method for making a semiconductor device, comprising:
providing a substrate comprising:
a substrate first surface;
a substrate second surface opposite to the substrate first surface; and
electronic devices formed as part of the substrate and separated by spaces, wherein each electronic device has pads formed over the substrate first surface;
attaching leadframe interconnects to the pads, wherein each leadframe interconnect spans the spaces between neighboring electronic devices, and wherein each leadframe interconnect comprises:
first regions coupled to respective pads of respective neighboring electronic devices and extending in a first direction, and
a second region structure connecting the first regions to each other in a second direction, wherein:
the second direction is substantially parallel to the substrate first surface; and
the second region structure is spaced apart from the substrate first surface; and
singulating the substrate and the leadframe interconnects to separate each second region structure into second regions and the substrate into individual electronic devices.

12. The method of claim 11, further comprising:
providing an encapsulant on the substrate first surface so that the encapsulant is between each of the leadframe interconnects and is between each of the leadframe interconnects and the substrate first surface.

13. The method of claim 12, further comprising:
forming grooves extending inward from the substrate first surface and within the spaces, wherein:
providing the encapsulant comprises providing the encapsulant within the grooves.

14. The method of claim 12, wherein:
a side surface of one of the electronic devices is devoid of the encapsulant.

15. The method of claim 11, wherein:
the first direction is different than the second direction.

16. A semiconductor device, comprising:
an electronic device comprising:
a device top surface;
a device bottom surface opposite to the device top surface;
a device side surface extending between the device top surface and the device bottom surface; and
pads disposed over the device top surface;
interconnects coupled to the pads, the interconnects comprising first regions and second regions, wherein:
the first regions are each coupled to a respective pad and extend in a first direction with respect to the device top surface;
the second regions each extend in a second direction with respect to the device top surface;
the second direction is substantially parallel to the device top surface; and
the interconnects comprise leadframe leads.

17. The semiconductor device of claim 16, further comprising:
an encapsulant that covers the device top surface and the first regions, wherein:
first portions of the second regions are exposed from a first surface of the encapsulant;
second portions of the second regions are exposed from a second surface of the encapsulant;
third portions of the second regions are covered by the encapsulant; and
the first portions and the second portions of the second regions adjoin at edge regions of the encapsulant.

18. The semiconductor device of claim 17, wherein:
the device side surface is devoid of the encapsulant.

19. The semiconductor device of claim 17, wherein:
the second portions of the second regions are end portions;
the second surface is a side surface of the encapsulant; and
the side surface is substantially coplanar with the end portions.

20. The semiconductor device of claim 16, wherein:
the first direction is substantially perpendicular to the device top surface.

\* \* \* \* \*